(12) United States Patent
Chan et al.

(10) Patent No.: US 7,666,775 B2
(45) Date of Patent: Feb. 23, 2010

(54) SPLIT POLY-SIGE/POLY-SI ALLOY GATE STACK

(75) Inventors: Kevin K. Chan, Staten Island, NY (US); Jia Chen, Ossining, NY (US); Shih-Fen Huang, Bedford Corners, NY (US); Edward J. Nowak, Essex Junction, VT (US)

(73) Assignee: International Businesss Machines Corporation, Armonk, NY (US)

( * ) Notice: Subject to any disclaimer, the term of this patent is extended or adjusted under 35 U.S.C. 154(b) by 0 days.

(21) Appl. No.: 12/104,570

(22) Filed: Apr. 17, 2008

(65) Prior Publication Data

US 2008/0200021 A1 Aug. 21, 2008

Related U.S. Application Data

(62) Division of application No. 10/680,820, filed on Oct. 7, 2003, now Pat. No. 6,927,454.

(51) Int. Cl.
*H01L 21/3205* (2006.01)

(52) U.S. Cl. .................. 438/592; 438/593; 257/413

(58) Field of Classification Search ............ 438/585, 438/587, 588, 592, 593; 257/407, 412–413
See application file for complete search history.

(56) References Cited

U.S. PATENT DOCUMENTS

| | | | |
|---|---|---|---|
| 4,835,112 A | 5/1989 | Pfiester et al. ............ 437/24 |
| 5,633,177 A | 5/1997 | Anjum ................ 438/301 |
| 6,252,283 B1 | 6/2001 | Gardner et al. ........... 257/407 |
| 6,255,149 B1 | 7/2001 | Bensahel et al. | |
| 6,373,112 B1 | 4/2002 | Murthy et al. | |
| 6,423,632 B1 | 7/2002 | Samavedam et al. ....... 438/652 |
| 6,492,694 B2 | 12/2002 | Noble et al. ............. 257/410 |
| 6,504,214 B1 | 1/2003 | Yu et al. ............... 257/347 |
| 2001/0020725 A1 | 9/2001 | Okuno et al. ........... 257/410 |
| 2002/0130378 A1 | 9/2002 | Forbes et al. ........... 257/412 |
| 2002/0185697 A1 | 12/2002 | Kim ................... 257/410 |
| 2003/0049919 A1 | 3/2003 | Yamamoto ............. 438/592 |
| 2005/0059213 A1* | 3/2005 | Steimle et al. .......... 438/260 |

* cited by examiner

*Primary Examiner*—Wael Fahmy
*Assistant Examiner*—Abul Kalam
(74) *Attorney, Agent, or Firm*—John A. Jordan

(57) ABSTRACT

A multi-layered gate electrode stack structure of a field effect transistor device is formed on a silicon nano crystal seed layer on the gate dielectric. The small grain size of the silicon nano crystal layer allows for deposition of a uniform and continuous layer of poly-SiGe with a [Ge] of up to at least 70% using in situ rapid thermal chemical vapor deposition (RTCVD). An in-situ purge of the deposition chamber in a oxygen ambient at rapidly reduced temperatures results in a thin $SiO_2$ or $Si_xGe_yO_z$ interfacial layer of 3 to 4 A thick. The thin $SiO_2$ or $Si_xGe_yO_z$ interfacial layer is sufficiently thin and discontinuous to offer little resistance to gate current flow yet has sufficient [O] to effectively block upward Ge diffusion during heat treatment to thereby allow silicidation of the subsequently deposited layer of cobalt. The gate electrode stack structure is used for both nFETs and pFETs.

7 Claims, 6 Drawing Sheets

SPLIT POLY-SIGE/POLY-SI ALLOY GATE STACK

This application is a divisional application of application Ser. No. 10/680,820, filed Oct. 7, 2003 now U.S. Pat. No. 6,927,454.

BACKGROUND OF THE INVENTION

1. Field of the Invention

The present invention relates to a field effect transistor structures and, more particularly, to a field effect transistor structures with a multi-layered gate electrode structures and process of making same.

2. Background and Related Art

Various types of integrated circuits are fabricated on semiconductor substrates and p-channel type field effect transistors and n-type field effect transistors are major circuit components of the integrated circuits. The desire for increased speed and density, however, has resulted smaller and smaller gate electrodes and extremely thin gate insulating layers. This has, in turn, resulted in what has been called the "short channel" effect which tends to occur in field effect transistors due to narrow gate widths.

One solution to the problem of "short channel" effect has been the introduction of dopant impurity, opposite to the channel conductivity, into the gate electrode. Boron, for example, is introduced into the polysilicon gate electrodes of p-channel type field effect transistors (pFETs) and arsenic or phosphorous is introduced into the polysilicon gate electrodes of n-channel type field effect transistors (nFETS).

Although this solution is effective in overcoming the "short channel" effect problem, it has manifested at least one other problem in its effective implementation. This problem is centered on the fact that the thermal energy required for activation of dopant impurity is very difficult to adjust. If the thermal energy is large, most of boron dopants in the gate electrode is fully activated. However, because the diffusivity of boron in silicon is high, atomic boron penetrates through gate insulating layer into the Si-channel. As a result, this creates another short channel effect problem. On the other hand, if the thermal energy is not sufficient, boron dopant is partially activated, leaving a considered amount of boron inactive at the boundary between the gate insulating layer and gate electrode. This creates gate electron depletion affecting, in turn, the integrity of the threshold of the gate.

A solution to this latter problem has been found by introducing germanium into the structure. This has been implemented in the prior art in a boron-doped multi-layered structure by including a layer of silicon-germanium (SiGe). Thus, multi-layered gate structures may comprise, for example, an amorphous silicon layer on the gate insulating layer and a SiGe layer laminated on the amorphous silicon layer. A polysilicon layer is, in turn, laminated on the SiGe layer and a cobalt silicide layer is then formed in self-aligned manner on the polysilicon layer. The germanium in the SiGe layer is thought to enhance activation of the boron doped in the silicon thereby reducing, or possibly eliminating, the amount of inactive boron and the resulting gate electrode depletion. Such an arrangement has been described in U.S. Patent Application Publication US2003/0049919A1.

Regardless of the mechanism, the electrically active concentration of boron in the SiGe polycrystalline multi-layer gate electrode structure has been demonstrated to significantly reduce gate electrode depletion in pFETs. For simplicity of integration, it is advantageous to use the same SiGe polycrystalline multi-layer electrode structure on nFETs doped with arsenic or phosphorous. However, it has been found that the high Ge concentration in the polysilicon results in very poor $CoSi_2$ formation on the gate structures, and particularly on the nFET gate structures.

The poor $CoSi_2$ formation has been attributed to the fact that the Ge diffusion coefficient in the SiGe alloy through poly-grain boundaries is extremely high. Because of the large thermal energy employed in CMOS integration, the Ge is up-diffused and achieves equilibrium through the poly gate. Therefore, poly-silicide formation of the poly-SiGe alloy gate and metal cobalt is practically impossible since cobalt is unreactive chemically with the element Ge. This results in, at best, in a coagulated and discontinuous layer of $CoSi_2$ on the poly-SiGe alloy gate. The end result is a high resistive gate. On the other hand, the element Ge is also known to have a high surface energy and, thus, the SiGe alloy material is extremely difficult to be made to chemically absorb on the gate dielectric structure of multi-layer polysilicon gate structures. In this regard, poly-SiGe alloy gate structures with low Ge concentrations can be formed on gate insulating layers. However, as Ge concentration is increased up to around 20% and above, SiGe alloy becomes discontinuous.

SUMMARY OF THE PRESENT INVENTION

It is, therefore, an object of the present invention to provide an improved FET device and method for making same.

It is a further object of the present invention to provide an improved FET device gate structure and process for so making.

It is another object of the present invention to provide an improved FET device and process therefor that permits the use of a single gate stack structure for nFETs and pFETs.

It is yet another object of the present invention to provide a FET gate structure that is simple, easy to fabricate and provides reliable gate control.

It is still yet another object of the present invention to provide a simple gate structure that is effective to avoid the deleterious effects of the thermal energy required to be employed for FET device fabrication.

In accordance with the present invention, a simple process and material solution acts to allow the use of a single gate stack structure for both nFETs and pFETs and results in both n-gate and p-gate electrode stacks which are easily silicided and p-gate electrodes with high boron activation and, hence, little gate electrode depletion. This is achieved by employing an insitu Rapid Thermal Chemical Vapor Deposition (RTCVD) process for creating an effective SiGe polycrystalline multi-layer gate electrode structure.

The RTCVD process is employed to first form the gate dielectric of $SiO_2$, for example. The process is then employed to grow a layer of nano-crystal Si silicon seeds on the gate dielectric. This, in turn, permits the deposition of poly-SiGe at high Ge concentrations. An in situ purge of the deposition chamber forms an atomic or monolayer layer of amorphous dielectric material, such as, a monolayer of $SiO_2$ or $Si_xGe_yO_z$. This occurs when a controlled amount of oxygen, $O_2$ reacts with the SiGe alloy surface at a low temperature and pressure regime, thereby producing a monolayer or atomic layer of amorphous $SiO_2$ or $Si_xGe_yO_z$. The chamber is then returned to the deposition mode wherein a layer of polysilicon is deposited. A layer of $CoSi_2$ may then readily be formed on the polysilicon.

The gate structure thus formed, in accordance with the present invention, is such that the nanocrystalline Si layer allows both continuity of RTCVD poly SiGe deposition even at high Ge concentrations and formation of small grain size.

In turn, the small grain size of the nanocrystalline Si layer allows both enhanced boron diffusion and boron activation. The formation of a monolayer of $SiO_2$, for example, on the poly-SiGe is sufficiently thin to readily permit current flow but yet is sufficient to block diffusion upwardly in the gate stack to the polysilicon layer so as to thereby allow good formation of $CoSi_2$, particularly on nFET gate structures.

DETAILED DESCRIPTION

Figure 1:
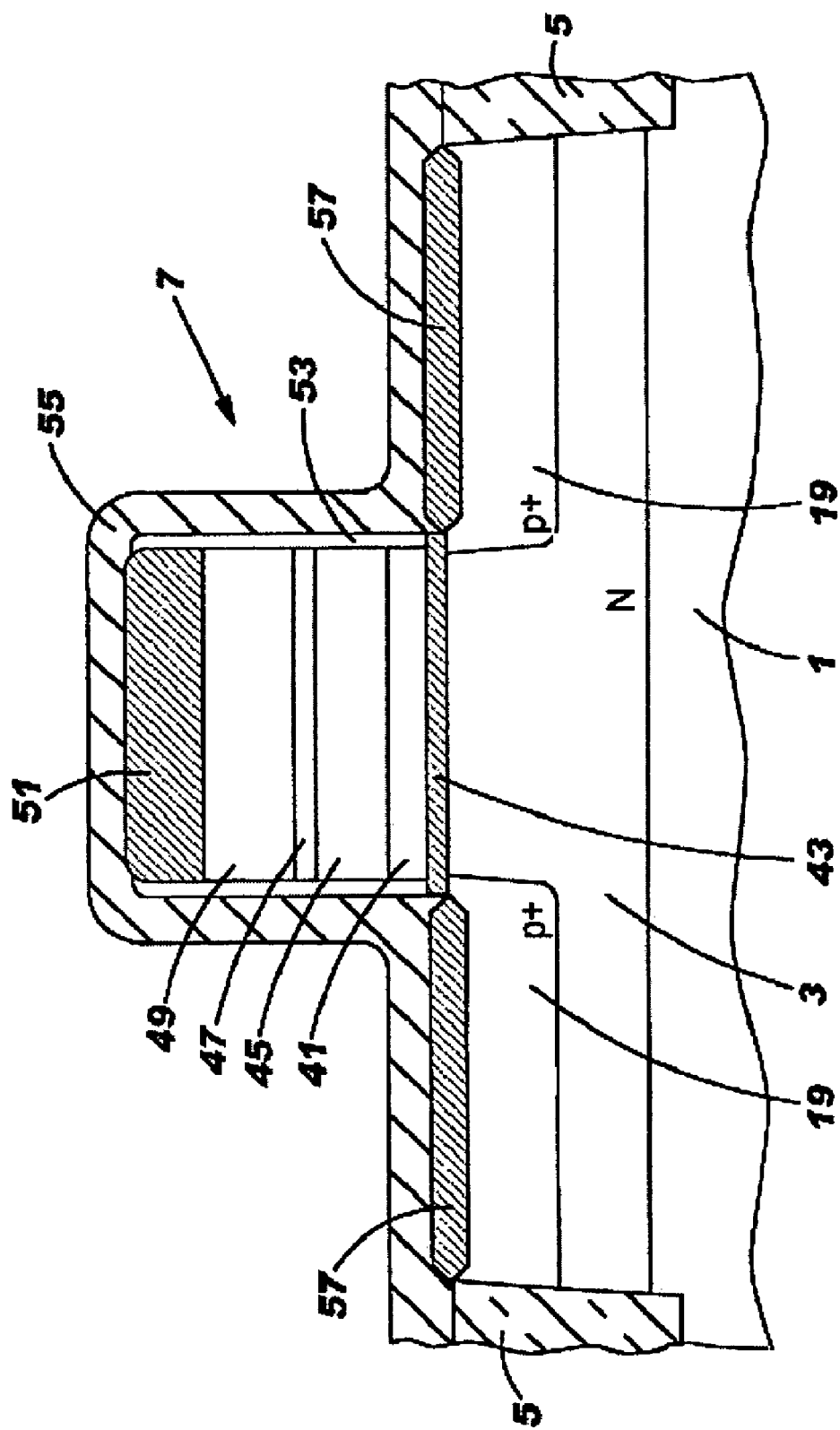
FIG. 1 shows a cross-sectional view of a p-channel type FET (pFET) with a gate stack structure, in accordance with the present invention.

With reference to FIG. 1, there is shown a cross-section of a pFET with a gate stack structure, as provided in accordance with the present invention. Other than the gate stack structure, the arrangement is a conventional configuration, as is understood by those skilled in the art, and represents only a portion of an integrated circuit structure wherein other pFETs and complementary nFETs may be fabricated on the same substrate. The pFET shown would typically be fabricated on p-type silicon (Si) substrate material (not shown) with p-type expitarial layer 1 formed thereon. A p-type dopant impurity is typically ion implanted into this selected region and an n-type well 3 is formed in the epitaxial layer 1. An nFET on this same substrate would be formed by masking the pFET region with a photoresist, for example, and then ion implanting on an n-type dopant into the nFET region. Shallow trench isolating regions 5 are formed which define the active region. An oxide layer 43 is then formed and the gate stack structure 7, in accordance with the present invention, is then formed. The P+ source and drain regions 19 are formed in epi layer 3 in conventional manner. It should be noted that the various layers and regions are not to scale.

The gate stack structure, in accordance with the present invention, comprises Si nano-crystal layer 41, poly-SiGe layer 45, $SiO_2$ interfacial mono layer 47, poly-Si layer 49 and $CoSi_2$ layer 51. The details of such layers and manner of fabrication will be explained hereinafter.

FIGS. 2A-2E show cross-sectional views depicting the progression of structure development in the steps which may be employed in fabricating nFETs and pFETs with the gate stack structure, in accordance with the present invention. The gate stacks 21N for the nFET and 21P for the pFET are shown for convenience to include the typical prior art layers of the same material for each, stacked on oxide layer 23. Typically, such a stack would comprise an amorphous silicon layer on oxide layer 23 followed by a layer of SiGe with the later topped with a poly-Si layer. It is also known to provide additional layers on the poly-Si layer. In such arrangements, a barrier layer of SiO may be deposited on the poly-Si followed by a layer of amorphous Si on the barrier SiO layer. Such an arrangement has been described, for example, in U.S. Patent Application Publication US 2003/0049919A1. The above-described barrier layer is taught to act as a barrier against Ge diffusion.

It should be noted that the Si layer on the gate oxide in the above-identified patent publication is amorphous Si with a grain size typically in the range of 800 to 900 Angstrom (Å) after anneal. Such grain size tends to limit the grain size of the SiGe alloy layer to be deposited thereon and the amount of Ge, i.e. [Ge], that can be deposited in the alloy. In addition, the grain size limits boron diffusion upon boron doping and subsequent gate activation.

The $SiO_x$ barrier in the above-identified publication is taught to be in the thickness range of 0.5 to 1.5 nm. Such thicknesses tend to limit current flow in the gate stack, i.e., create higher than desirable resistance. In addition, such thicknesses are not created in situ but necessitate removal from the deposition chamber.

Figure 2A:
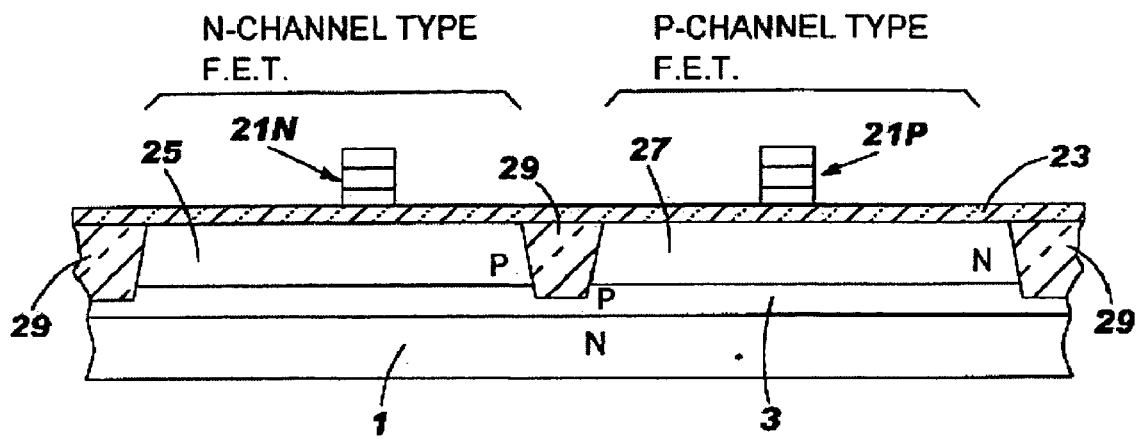
FIGS. 2A-2E show cross-sectional views depicting the progression of structure development in the steps employed to fabricate complementary pFETs and nFETs with the gate stack structure, in accordance with the present invention.

With reference to FIG. 2A, before the gate stacks 21N and 21P are formed, a p-type dopant impurity is ion implanted into p-type epi layer 3 on substrate 1 to form p-type well 25, an n-type dopant impurity is ion implanted into the epi layer to form an n-type well 27 and isolating region 29 is formed. Here, shallow trench isolation is employed which isolation defines the active area region of the devices. At this point in the process, gate stack structures represented by 21N and 21P are then formed.

Figure 3A:
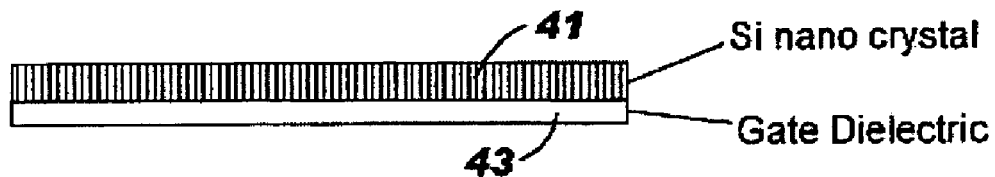
FIGS. 3A-3E are cross-sectional views used to describe a process for fabricating the gate structure, according to the present invention.

In accordance with the present invention, a gate stack structure 7, as represented in FIG. 1, is formed. The steps of forming gate stack structure 7 are best described with reference to FIGS. 3A-3E. The process starts, as shown in FIG. 3A, with depositing a Si nano crystal layer 41 on gate dielectric 43. Gate dielectric 43 may be a layer of $SiO_2$. The Si nano crystal layer is deposited by Rapid Thermal Chemical Vapor Deposition (RTCVD) using $SiH_4$ gas to react with the Si substrate at 600° C. and 5 to 20 Torr pressure for 5 to 10 seconds. The Si nano crystal layer is deposited to a thickness of 30 to 60 Å with a grain size of 2 to 10 nm in diameter of generally hemispherical shape. Grain sizes in the range from 30 to 200 Å in diameter have also been found to be effective. These particles act as a Si seed layer on the gate dielectric facilitating subsequent small grain size poly-SiGe surface growth thereon.

An alternative approach to forming the Si nano crystal layer is by spin on deposition. For example, a spin on Si nano crystal layer can be formed by spin casting a dilute colloidal suspension of porous Si nanoparticles (~1 nM). p-type Si was anodically etched in HF:ethanol (1:4) for 30 min. The resulting porous silicon layer was mechanically removed from the surface and sonicated in hexanes to reduce particle size. The sonicated solution was filtered through a 200 nm filter to yield a stock solution. Only the smallest particles are suspended in the stock solution due to its finite solubility in hexane.

Figure 4:
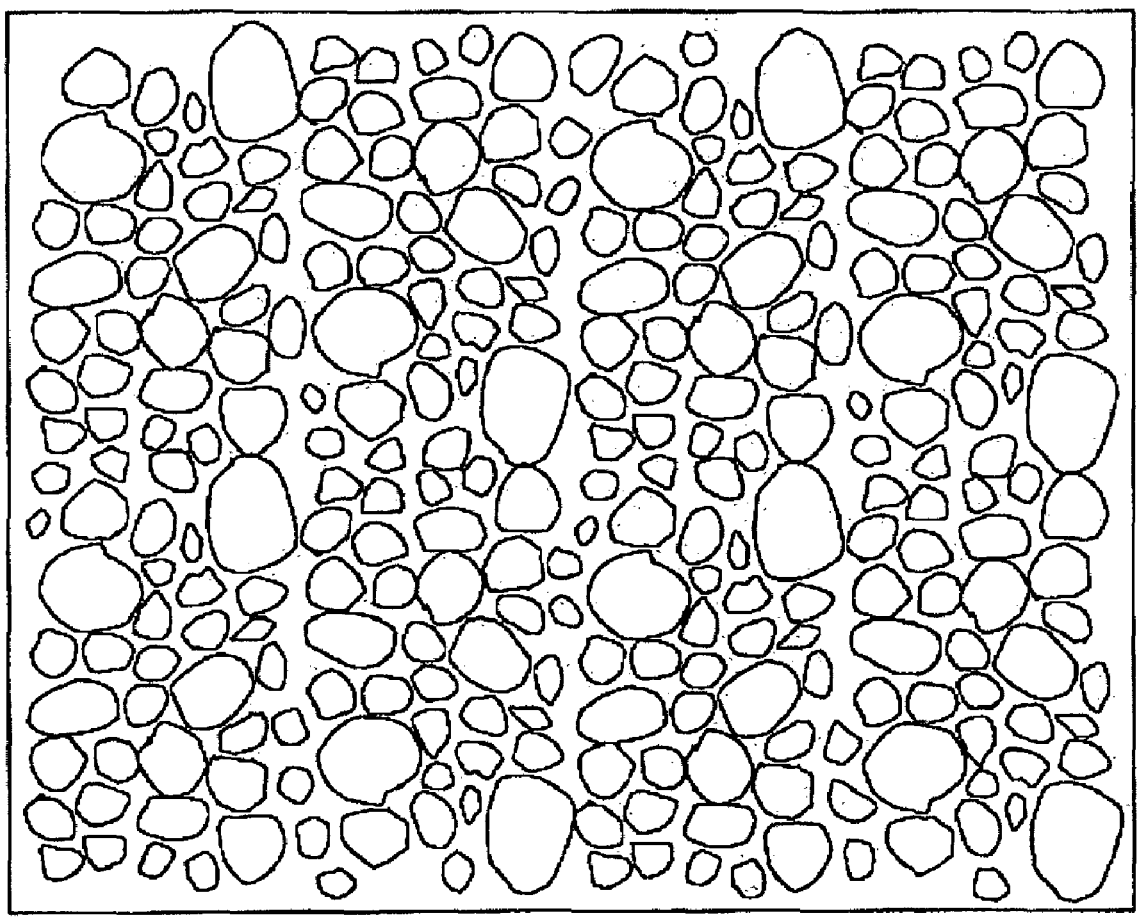
FIG. 4 shows a schematic approximate reproduction of a top view of a layer of Si nano crystal, as taken by a scanning electron microscope.

FIG. 4 shows an approximate graphic representation of a top view of a layer of Si nano crystal as taken by a scanning electron microscope. As can be seen from the 100 nm reference on FIG. 4, the crystal grain sizes exhibit a diameter substantially less than 100 nm with a density of about e13 ($10^{13}$) particles/$cm^2$.

Figure 3B:
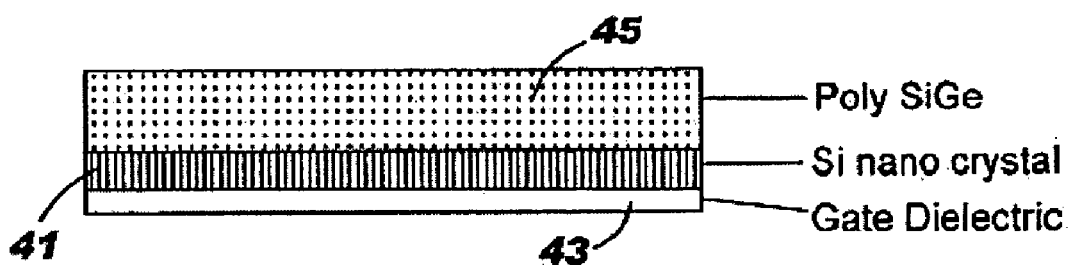

With reference to FIG. 3B, after deposition of the Si nano crystal layer 41, a uniform and continuous poly-SiGe alloy layer 45 is deposited on top of the nano crystal Si seeds. This layer is deposited in situ in the RTCVD chamber using 100 sccm of $SiH_4$ and 65 sccm of $GeH_4$ to form SiGe of 25% at 650° C. and 20 Torr pressure. As $GeH_4$ gas flow increases to 140 sccm to react with the same amount of $SiH_4$, a poly-SiGe 45% alloy layer is formed. Further increases in the $GeH_4$ gas flow with the same amount of $SiH_4$ will take the Ge concentration in alloy up to at least 70%. It should be noted, again, that the thicknesses of layers depicted in FIGS. 3A-3E are not to scale nor necessarily accurate relative to one another.

The deposited poly-SiGe alloy layer 45 is typically 100 nm thick and shows continuity with the underlying Si nano crystal layer. The poly-SiGe alloy grain size diameter typically averages a relatively uniform 400 A with the Si nano crystal seeds providing the growth structure for such small uniform grain sizes. The small grain size of the poly-SiGe alloy layer, in turn, allows for concentrations of Ge in the alloy of up to at least 70% with the continuity of the RTCVD-formed poly-SiGe being maintained over such [Ge] range. Typically, Ge concentrations of approximately 25% and above would otherwise cause discontinuous poly-SiGe.

Figure 3C:
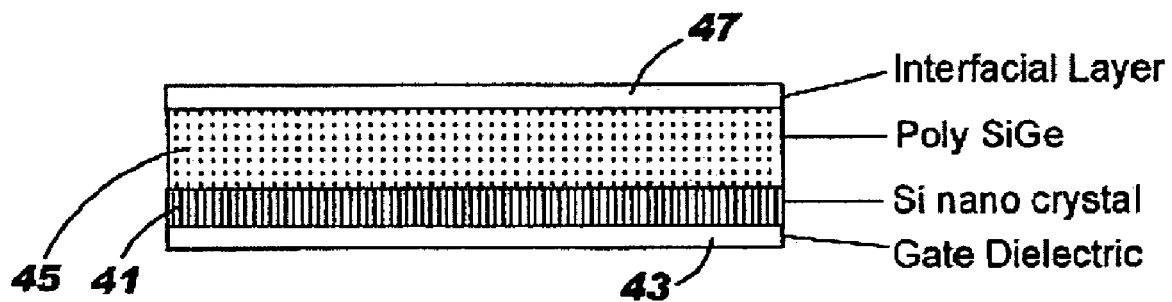

With reference to FIG. 3C, after RTCVD of the poly-SiGe alloy layer, an interfacial layer 47 of one or two monolayers of ultra thin $SiO_2$ or $Si_xGe_yO_z$ is grown in situ. RTCVD permits temperature change as rapid as 50° C./sec. An in situ purge of the deposition chamber in an oxygen ambient at rapidly reduced temperature levels, such as 300° C. to 500° C., results in a thin $SiO_2$ or $Si_xGe_yO_z$ interfacial layer of 2 to 4 A. The $SiO_2$ or $Si_xGe_yO_z$ layer formed using RTCVD provides well controlled thickness with in situ growth without breaking the chamber pressure for the whole gate electrode deposition.

The ability of RTCVD to rapidly ramp up and down in temperature is important in minimizing Ge diffusion into other layers and formation of enough $Si_xO_y$ or $Si_xGe_yO_z$. Such $Si_xO_z$ layer, which is typically $SiO_2$, is, however, sufficiently thin that the structure of the barrier may generally take the form characterized by the expression $Si_xGe_yO_z$. Since this one or two monolayer interfacial layer containing [O] is extremely thin, it is difficult to identify its precise composition analytically. Accordingly, the best formulation has been found to be $Si_xGe_yO_z$ which indicates that both Si and Ge have opportunity to form "oxides". The resultant effect was detected by SIMS analysis that show the blocking function of Ge up-diffusion from Poly-Si layer 45.

It should be noted that the $SiO_2$ or $Si_xGe_yO_z$ monolayer 47 is sufficiently thin so as to not be continuous. As a result, monolayer 47 can be electrically conductive so as to pass current but yet there is enough [O] to stop Ge which may otherwise diffuse into the subsequently deposited poly-Si layer, shown in FIG. 3D. Thus, $SiO_2$ or $Si_xGe_yO_z$ monolayer 47 is a barrier to Ge but yet does not create a significant resistance to current flow in the gate stack.

Figure 3D:
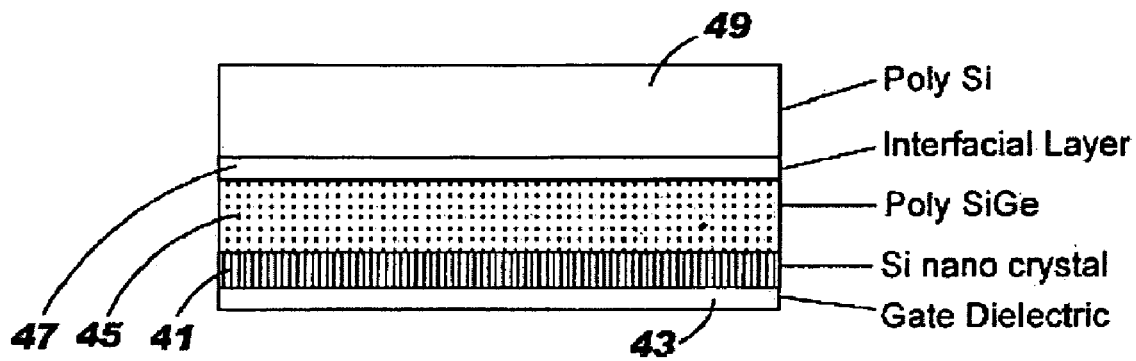

After growth of $SiO_2$ or $Si_xGe_yO_z$ interfacial layer 47, a thin poly-Si film 49 is deposited on top of the $SiO_2$ or $Si_xGe_yO_z$ layer, as shown in FIG. 3D. The poly-Si layer 49 is approximately 300 A thick and is deposited by reaction of 0.7 slm of $SiH_4$ at 710° C. and 15 Torr. The thin poly-Si layer is used for Co silicidation since poly-Si readily reacts with Co to form $CoSi_2$ while Ge does not.

Figure 3E:
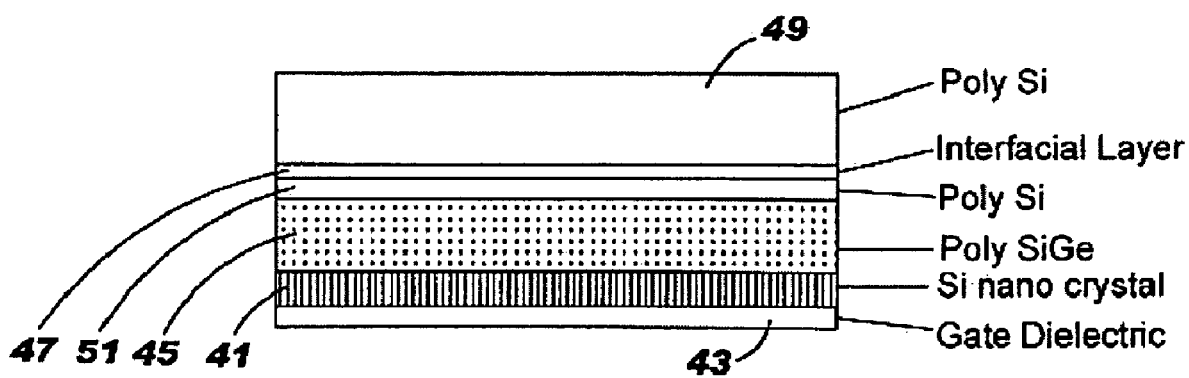

FIG. 3E shows an alternative gate stack structure to that shown in FIG. 3D. The difference in the gate stack structure shown in 3E from that shown in FIG. 3D is in the inclusion of poly-Si layer 51. Such layer is deposited in situ on poly SiGe 45 to a thickness of approximately 100 to 300 A employing a gas reaction of 0.7 slm of $SiH_4$ gas at 710° C. and 15 Torr. As can be seen, interfacial layer 47 splits the poly-Si gate electrode of the gate stack. The advantage of including poly-Si layer 51 in the gate stack is that it further facilitates the growth of ultra-thin interfacial layer 47 of $SiO_2$. This ultra-thin interfacial oxide layer results from low temperature [~400° C.] oxidation on the poly-Si surface based upon the reaction of $O_2+Si \longrightarrow SiO_2$ without Ge involvement, as was the case in the arrangement of FIG. 3D.

Figure 2B:
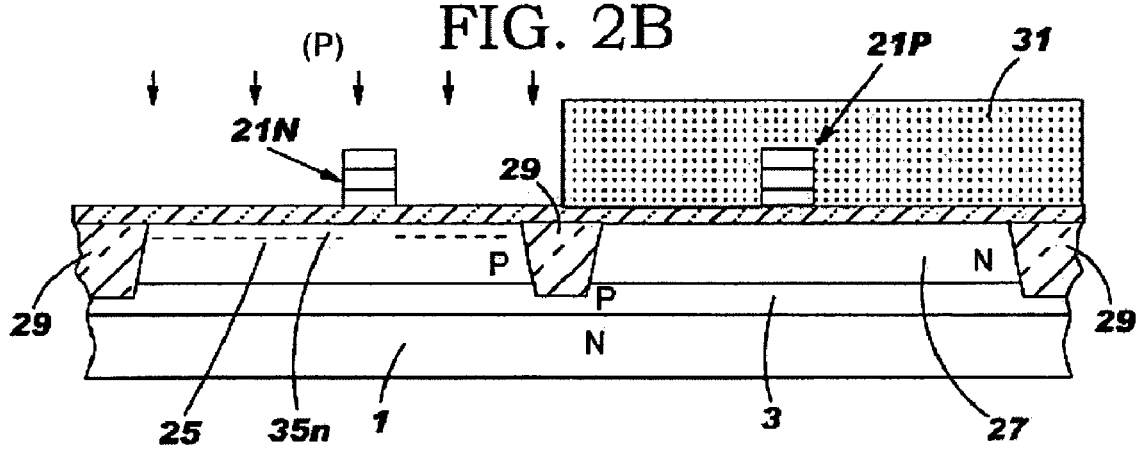

Again, with reference to FIGS. 2A-2E, after formation of the gate stack structures shown in FIGS. 3D and 3E, the process continues in the formation of complementary nFETs and pFETs. It should be noted that the gate stack structures 21N and 21P for respective nFET device and pFET device are the same thereby simplifying the process. As shown in FIG. 2B, the gate stack structure 21P is then covered with a masking photoresist 31 formed through photolithography. This leaves gate stack structure 21N and adjacent active region 25 exposed so that they may be ion implanted with an n-type dopant such as, for example, phosphorous. Phosphorous is implanted with an acceleration energy sufficient to reach into the polysilicon layer 49 in FIGS. 3D and 3E. Thus, n-type doped regions 35n on each side of the gate stack are produced in self-aligned manner.

Figure 2C:
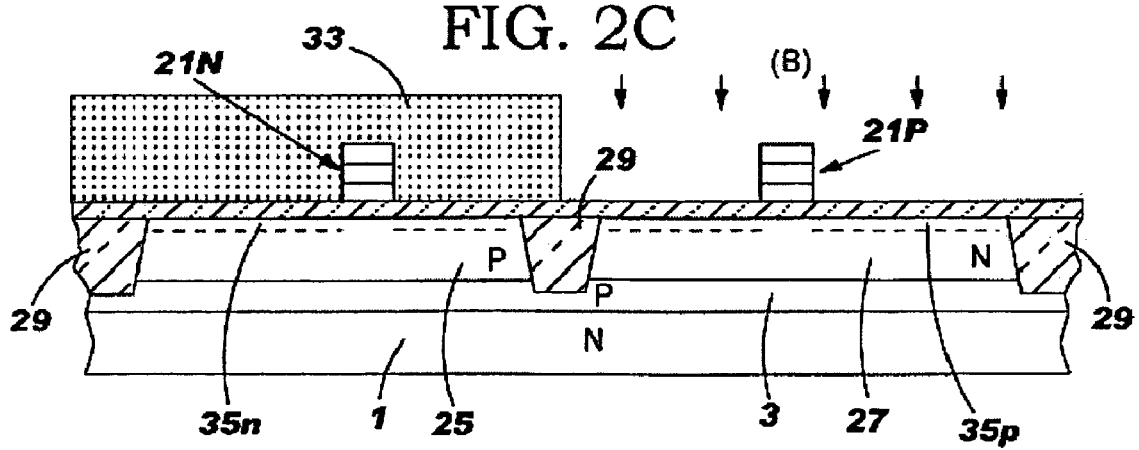

Similarly, as shown in FIG. 2C, gate stack structure 21n is covered with a photoresist 33 leaving gate stack structure 21p and active n-type well area 27 exposed. Boron, for example, may then be ion implanted into gate stack structure 21P and surrounding active region. As with gate stack structure 21N, the boron is implanted with an acceleration energy sufficient to reach into the poly-Si layer 49, as shown in FIGS. 3D and 3E. Again, self-aligned p-type doped regions 35p are formed on each side of gate stack structure 21P.

Figure 2D:
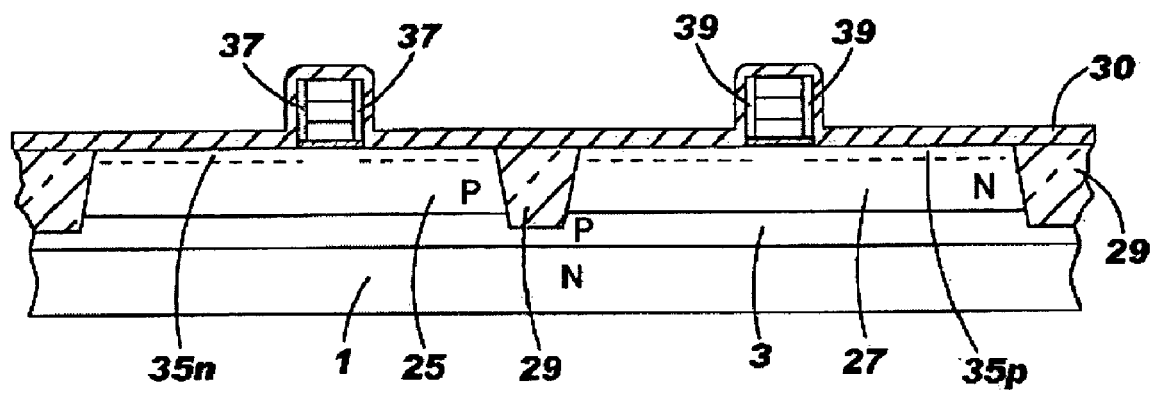

As shown in FIG. 2D, oxide sidewall insulating spacers 37 and 39 are formed on the sidewalls of the gate stack structures and then a layer 30 of cobalt is conformally deposited over the entire surface of the resultant semiconductor structure.

The structure is then subjected to a heat treatment wherein the ion-implanted boron and ion-implanted phosphorous are activated and the cobalt is selectively silicided in reaction with poly-Si layer 49, as previously shown with reference to FIGS. 3D and 3E. The resulting $CoSi_2$ layer is shown as layer 51 in the gate stack structure, in accordance with the present invention, shown in FIG. 1. This $CoSi_2$ layer is shown as layer 32 in the general gate stack used to describe the process in FIG. 2E.

Figure 2E:
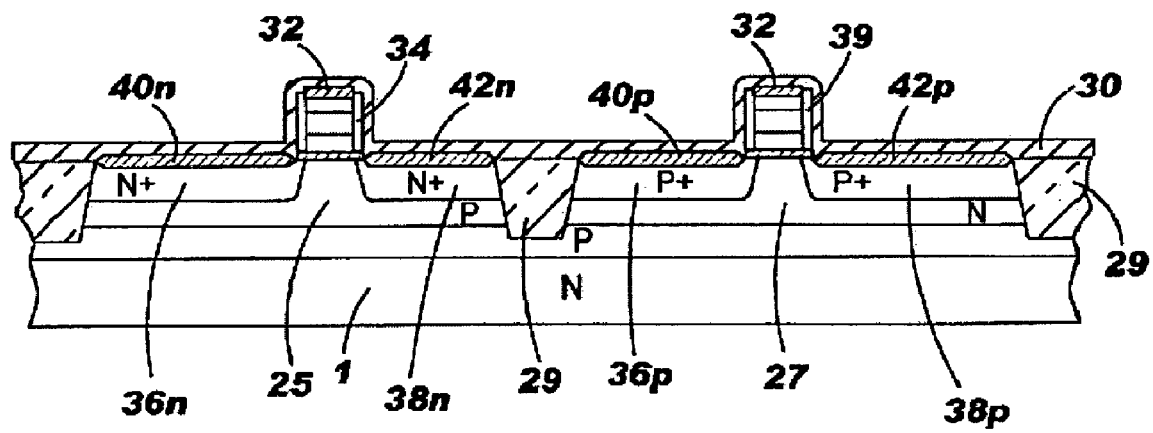

Thus, while the thermal energy is being applied, the phosphorous implanted regions 35n and boron implanted regions 35p are cured as shown in FIG. 2E, and the implanted regions are diffused to form shallow phosphorous-doped and shallow boron-doped source and drain regions, as shown at 36n-38n and 36p-38p.

While the ion-implanted dopant impurities are being activated in the doped regions 35n and 35p, the thermal energy further acts to make this ion-implanted phosphorous and ion-implanted boron active in the gate structures 21N and 21P. The small grain size of the Si nano crystal layer 41 in FIGS. 3A-3D acts to both enhance boron diffusion and aid in gate activation.

Although the thermal energy is such as to make the ion-implanted phosphorous highly activated, the Ge promotes complete activation and provides higher solubility of the ion-implanted boron. On the other hand, the upward diffusion of the Ge into the top of the stack is prevented by interfacial $SiO_2$ or $Si_xGe_yO_z$ layer 47, as shown in FIGS. 3D and 3E, whereby poly-Si/Co silicidation is carried out without the use of a Ge barrier that causes resistance to current flow through the gate stack. In addition, the formation of the interfacial $SiO_2$ or $Si_xGe_yO_z$ layer 47 by the RTCVD process acts to minimize the Ge diffusion into other layers.

A subsequent annealing step causes a reaction between the silicon at the top of the gate stacks and the cobalt to thereby form $CoSi_2$ layer 32, as previously described. In addition, the cobalt also reacts with the doped regions 36n, 38n, 36p and 38p to form CoSi$_2$ contacts 40n, 42n, 40p and 42p in self-aligned fashion. The remaining cobalt of layer 30 is then etched away.

With reference to the gate stack structure in accordance with the present invention, reference is made, again, to the pFET depicted in FIG. 1. The overall pFET structure shown in FIG. 1 is the same as the pFET structure shown in FIG. 2E except for the gate stack structure. Thus, in accordance with the present invention, the gate stack structure of FIGS. 2A-2E is replaced by the gate stack structure shown in FIG. 1 and the fabrication process depicted in FIGS. 3A-3D. Although not shown in FIG. 1, it is clear that an nFET structure would, similarly, be the same as the nFET structure shown in FIG. 2E with the same gate stack structure shown in FIGS. 3A-3D. The gate stack structure shown in FIG. 3E could readily replace the gate stack structure of FIG. 3D.

FIG. 1, then, shows a silicon epitaxial layer 1, an n-well layer 3 and p+ doped regions 19. Isolation region 5 defines the active area region. The gate stack 7 of the present invention sits on gate oxide 43. The stack structure comprises Si nano crystal layer 41, poly SiGe layer 45, mono interfacial layer 47 and poly Si layer 49. Layers of CoSi$_2$ are shown at 51 and 57 with the remainder of the conformal cobalt layer shown at 55. It is clear that the latter layer may be readily etched away and a layer of insulating material conformally deposited upon the structure.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

The invention claimed is:

1. A method for fabricating a gate electrode of a field effect transistor device, comprising the steps of:
    providing a Si semiconductor layer having at least one gate insulating layer region formed of SiO$_2$ on a portion of said semiconductor layer and doped semiconductor regions adjacent thereto;
    forming a Si nano crystal layer on said gate insulating layer in a rapid thermal chemical vapor deposition chamber using SiH$_4$ gas at approximately 600° C. and 5 to 20 Torr pressure for 5 to 10 seconds;
    forming a poly-SiGe alloy layer on said Si nano crystal layer in situ in said rapid thermal chemical vapor deposition chamber using SiH$_4$ and GeH$_4$ to form said poly-SiGe alloy layer with a germanium concentration of up to at least 70%;
    forming a silicon oxide layer on said poly-SiGe layer in situ in said rapid thermal chemical vapor deposition chamber by an in situ purge of the deposition chamber in an oxygen ambient to form said silicon oxide layer with said silicon oxide layer formed sufficiently thin so as to offer little resistance to current flow and with sufficient oxide concentration to block upward Ge diffusion upon heating; and
    forming a poly-Si layer on said oxide layer.

2. The method as set forth in claim 1 wherein said Si nano crystal layer is formed 3 to 6 nm thick with a grain size of 20 to 150 Å in diameter.

3. The method as set forth in claim 2 wherein said silicon oxide layer is 2 to 4 Å thick.

4. The method as set forth in claim 3 wherein said silicon oxide layer is formed by an in situ purge of said rapid thermal chemical vapor deposition chamber in an oxygen ambient at rapidly reduced temperature levels of 300 to 500° C.

5. The method as set forth in claim 4 including the steps of conformally depositing a layer of Co upon said poly-Si layer and said doped regions adjacent thereto and applying heat to said semiconductor layer to activate said doped regions and form CoSi$_2$ on said poly-Si layer and said doped regions.

6. The method as set forth in claim 5 wherein said semiconductor layer having at least one gate insulating layer region comprises at least two gate insulating layer regions with one gate insulating layer region formed on a p-type well and the other formed on an n-type well and wherein said p-type well is ion implanted with phosphorous or arsenic and said n-type well is ion implanted with boron so that said step of applying heat activates said phosphorous or arsenic and said boron with said Ge in said poly-SiGe enhancing said activation of boron.

7. The method as set forth in claim 4 wherein said poly-SiGe alloy layer is formed in situ in said rapid thermal chemical vapor deposition chamber using 100 sccm of SiH$_4$ and up to 140 sccm or more of GeH$_4$ to form a Ge concentration of up to at least 70%.

* * * * *